(12) United States Patent
Liu et al.

(10) Patent No.: US 8,058,557 B2
(45) Date of Patent: Nov. 15, 2011

(54) PRINTED CIRCUIT BOARD

(75) Inventors: Chien-Hung Liu, Taipei Hsien (TW);
Shou-Kuo Hsu, Taipei Hsien (TW);
Chia-Nan Pai, Taipei Hsien (TW)

(73) Assignee: Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 1003 days.

(21) Appl. No.: 11/957,416

(22) Filed: Dec. 15, 2007

(65) Prior Publication Data
US 2009/0065238 A1 Mar. 12, 2009

(30) Foreign Application Priority Data
Sep. 6, 2007 (CN) ............... 2007 1 0201607

(51) Int. Cl.
*H05K 1/00* (2006.01)
(52) U.S. Cl. ........ 174/250; 174/261; 361/777; 361/778; 333/5; 333/12; 333/33

(58) Field of Classification Search ............. 174/250, 174/261, 262; 361/748, 777, 778, 780, 794; 333/5, 12, 246, 260, 33
See application file for complete search history.

(56) References Cited

U.S. PATENT DOCUMENTS

| | | | |
|---|---|---|---|
| 7,232,959 B2 * | 6/2007 | Hsu ................... | 174/261 |
| 2005/0098346 A1 * | 5/2005 | Fan et al. .............. | 174/260 |
| 2006/0244124 A1 * | 11/2006 | Ohlsson .............. | 257/700 |

* cited by examiner

*Primary Examiner* — Angel R Estrada
*Assistant Examiner* — Dimary Lopez
(74) *Attorney, Agent, or Firm* — Altis Law Group, Inc.

(57) ABSTRACT

An exemplary PCB includes a first reference layer, a first signal layer, a second signal layer, and a third signal layer in that order, a first differential pair is arranged in the first signal layer in edge-coupled structure and references the first reference layer, a distance between the first signal layer and the second signal layer is greater than a distance between the first reference layer and the first signal layer, a second differential pair is arranged in the second signal layer and the third signal layer in broad-coupled structure. The PCB has a high density layout of transmission lines.

9 Claims, 3 Drawing Sheets

PRINTED CIRCUIT BOARD

BACKGROUND

1. Field of the Invention

The present invention relates to a printed circuit board (PCB), and particularly to a PCB with a high density layout of transmission lines.

2. Description of Related Art

Differential pairs are often used in a multi-layer PCB to transmit signals. Referring to FIG. 2, a conventional PCB has edge-coupled differential pairs 17, 18 defined in signal layers 12 and 15 respectively to transmit signals, the differential pair 17 includes two transmission lines 171 and 172, the differential pair 18 includes two transmission lines 181 and 182. In order to achieve high signal quality, the layers 11, 13 above and below the differential pair 17 are set as reference layers, and the layers 14, 16 above and below the differential pair 18 are set as reference layers. In the PCB of FIG. 2, there are four layers 11, 13, 14, and 16 acting as reference layers, only two layers 12 and 15 acting as signal layers.

Referring to FIG. 3, another conventional PCB has edge-coupled differential pairs 27, 28 and 29 defined in signal layers 22, 23, and 25 respectively. A reference layer 21 is disposed above the differential pair 27, a reference layer 24 is disposed below the differential pair 28, and reference layers 24 and 26 are disposed above and below the differential pair 29 respectively. In the PCB of FIG. 3, there are three layers 21, 24, and 26 acting as reference layers, and three layers 22, 23 and 25 acting as signal layers. Because in the conventional PCB, the edge-coupled differential pairs are used to transmit signals, there must be at least one reference layer disposed near the signal layer where the differential pairs are defined to obtain good signal quality, at least one inner layer of the PCB is occupied as the reference layer, therefore the density of the layout of transmission lines is not maximized.

What is needed, therefore, is a PCB with a high density layout of transmission lines.

SUMMARY

An exemplary PCB includes a first reference layer, a first signal layer, a second signal layer, and a third signal layer in that order, a first differential pair is arranged in the first signal layer in edge-coupled structure and references the first reference layer, a distance between the first signal layer and the second signal layer is greater than a distance between the first reference layer and the first signal layer, a second differential pair is arranged in the second signal layer and the third signal layer in broad-coupled structure.

Other advantages and novel features will become more apparent from the following detailed description when taken in conjunction with the accompanying drawings, in which:

DETAILED DESCRIPTION

Figure 1:
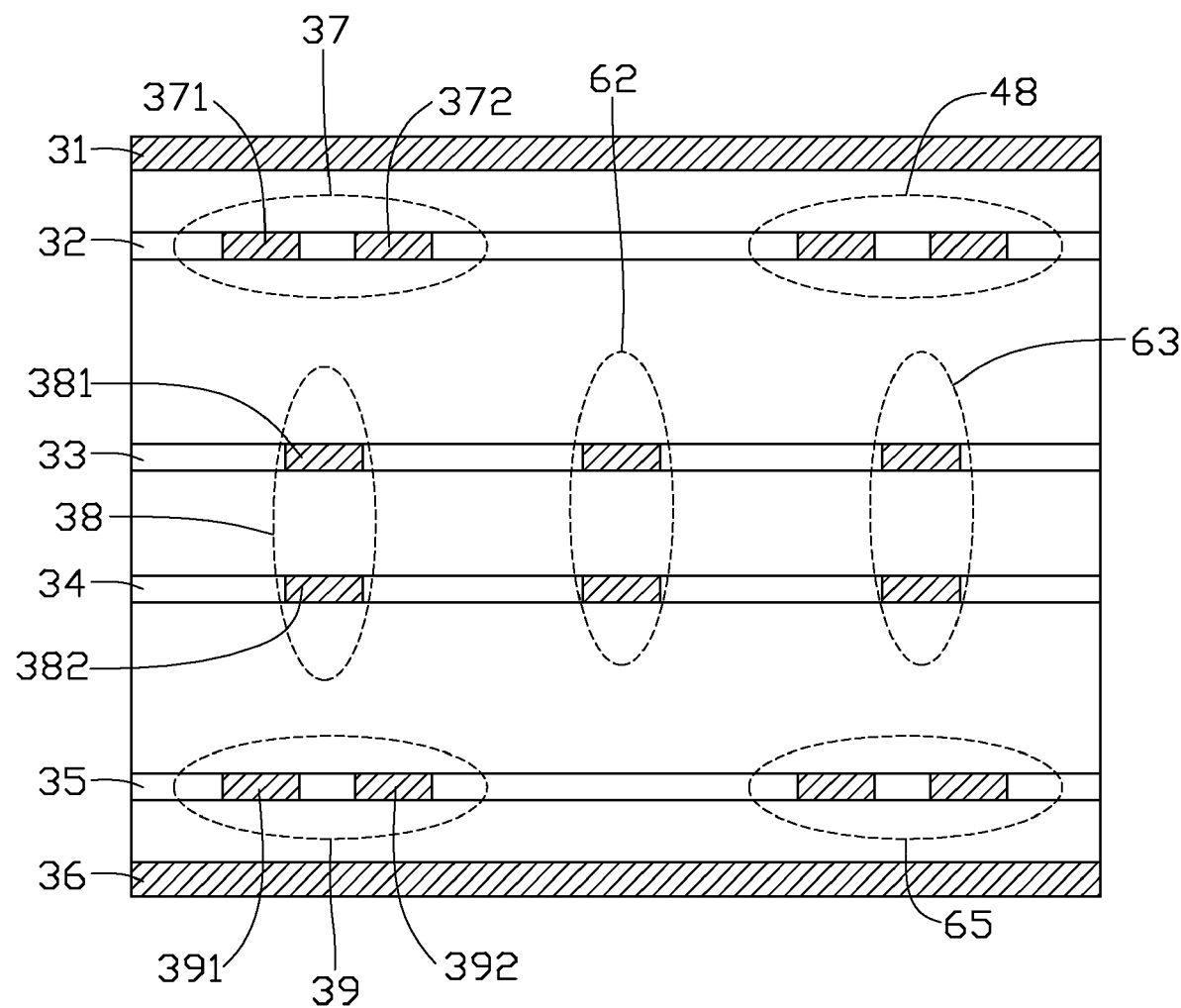
FIG. 1 is a cross-sectional view of a PCB according to a first embodiment of the present invention.
Figure 2:
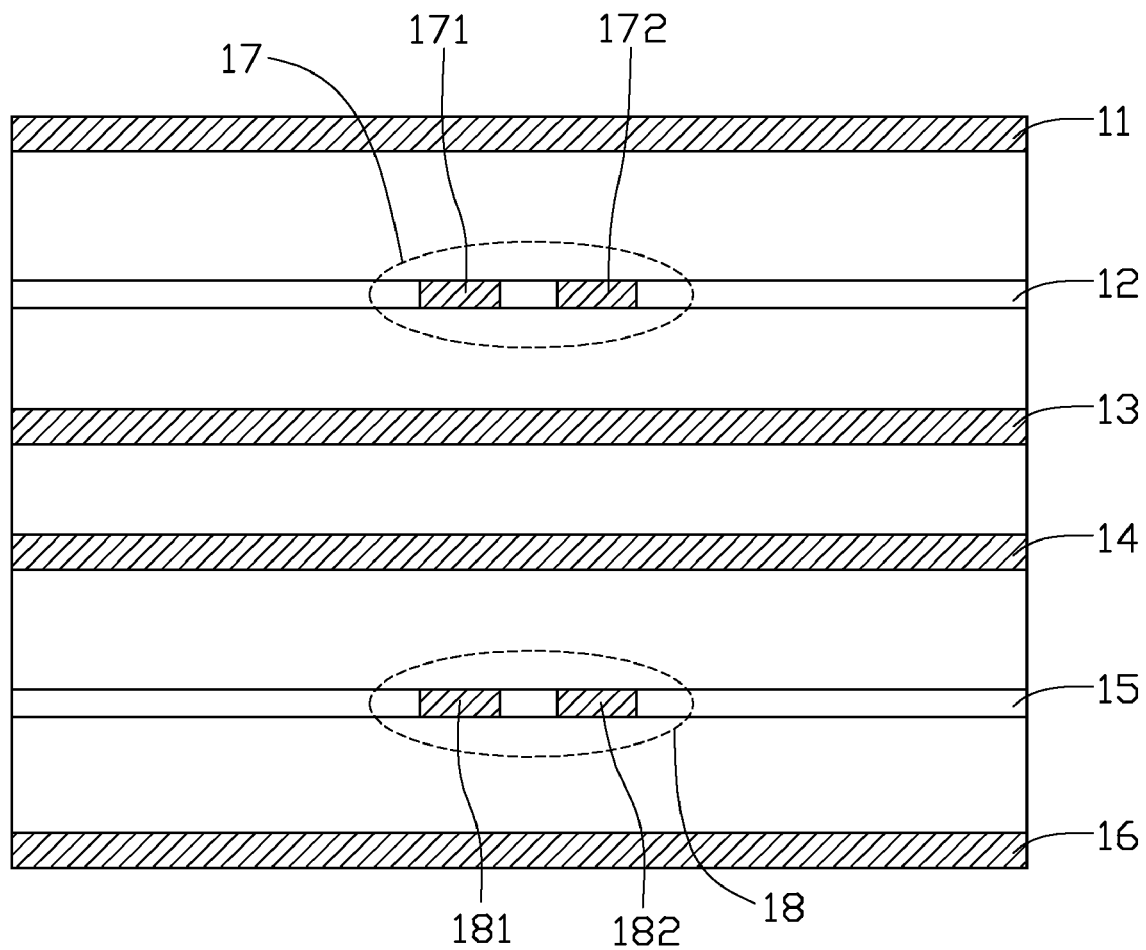
FIG. 2 is a cross-sectional view of a conventional PCB.
Figure 3:
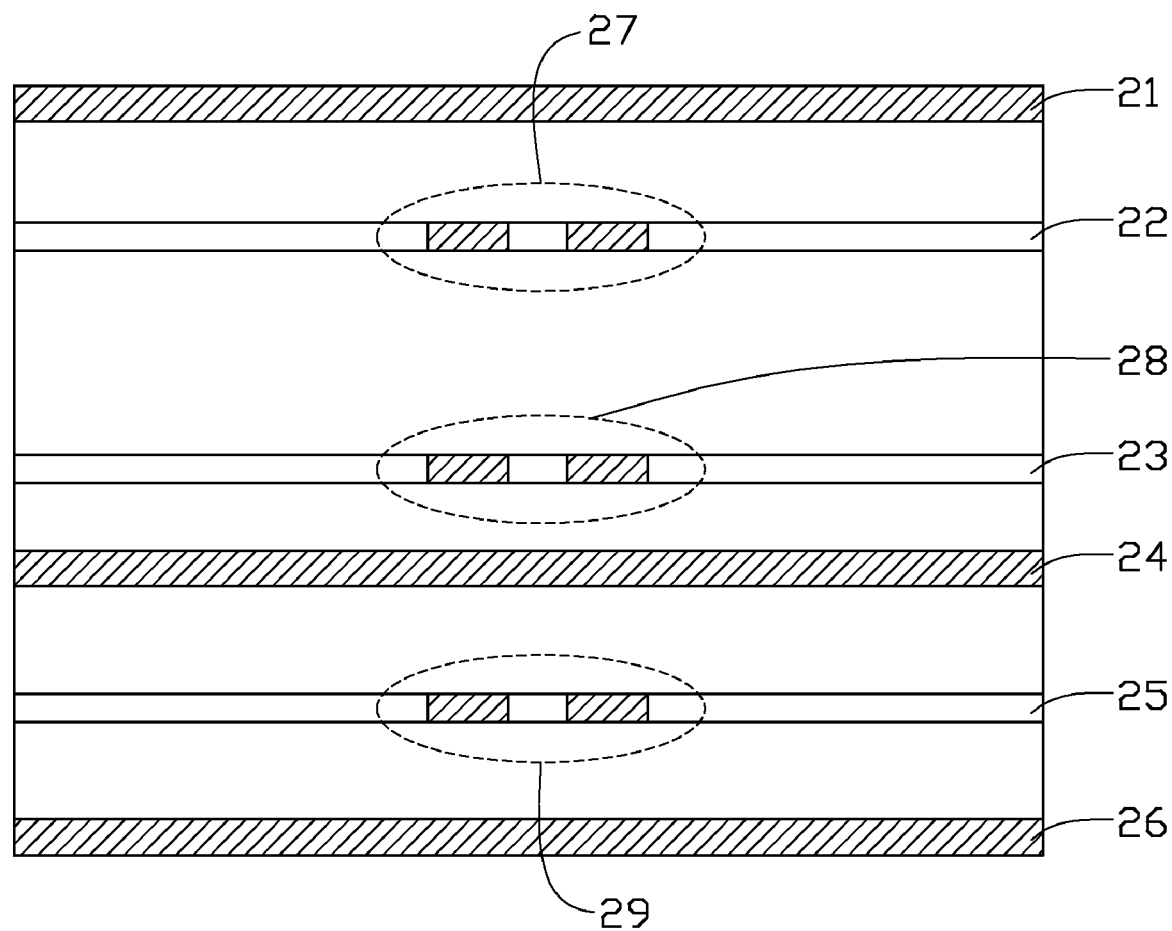
FIG. 3 is a cross-sectional view of another conventional PCB.

Referring to FIG. 1, a PCB in accordance with an embodiment of the present invention includes a first reference layer 31, a first signal layer 32, a second signal layer 33, a third signal layer 34, a fourth signal layer 35, and a second reference layer 36 in order. The first and second reference layers 31 and 36 can be signal layers or ground layers. An edge-coupled differential pair 37 consisting of two transmission lines 371 and 372 arranged side-by-side is formed in the first signal layer 32. A broad-coupled differential pair 38 is arranged in the second signal layer 33 and the third signal layer 34, the differential pair 38 includes a transmission line 381 arranged in the second signal layer 33, and a transmission line 382 arranged in the third signal layer 34. An edge-coupled differential pair 39 consisting of two transmission lines 391 and 392 arranged side-by-side is formed in the fourth signal layer 35. The differential pair 38 is arranged along a line perpendicularly bisecting a segment between the transmission lines 371 and 372. Compared to the conventional PCB, a distance between the first reference layer 31 and the first signal layer 32 is less, a distance between the first signal layer 32 and the second signal layer 33 is greater, a distance between the third signal layer 34 and the fourth signal layer 35 is greater, and a distance between the fourth signal layer 35 and the second reference layer 36 is less. Thus, the differential pair 37 only references the first reference layer 31, the differential pair 39 only references the second reference layer 36. The electromagnetic field of the differential pair 37 is mainly induced between the transmission lines 371 and 372, and between the differential pair 37 and first reference layer 31, seldom between the second signal layer 33 and the third signal layer 34. The electronic field of the differential pair 39 is mainly induced between the transmission lines 391 and 392, and between the differential pair 39 and second reference layer 36, seldom between the second signal layer 33 and third signal layer 34. The differential pair 38 arranged along the perpendicular bisector of the segment between the transmission lines of 371 and 372 can reduce crosstalk interference of the differential pairs 37 and 39. The electromagnetic field of the differential pair 38 is mainly induced between the transmission lines 381 and 382, and seldom induced between the first signal layer 32 and the fourth signal layer 35. Therefore, there are only two reference layers disposed in the PCB of FIG. 1, the other four layers are configured to arrange transmission lines thereon, thus the density layout of transmission lines is increased, while at the same time maintaining signal quality.

Beneficially, when the distance between the second signal layer 33 and the first signal layer 32 is greater than or equal to four times the distance between the first reference layer 31 and the first signal layer 32, the broad-coupled differential pairs in the second signal layer 33 and the third signal layer 34 can be freely arranged as desired, and space between every two adjacent differential pair is enough to reduce interference between differential pairs. In this embodiment, a plurality of other differential pairs defined in the PCB. An edge-coupled differential pair 48 is formed in the first signal layer 32. Two broad-coupled differential pairs 62 and 63 are arranged in the second signal layer 33 and the third signal layer 34. An edge-coupled differential pair 65 is formed in the fourth signal layer 35. The differential pairs 38, 62, 63 may be arranged without regard for alignment with the differential pairs 37, 48, 39, 65.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A printed circuit board (PCB), comprising a first reference layer, a first signal layer, a second signal layer, and a third signal layer in that order, a first differential pair arranged in the first signal layer in edge-coupled structure and reference the first reference layer, a distance between the first signal layer and the second signal layer being greater than a distance between the first reference layer and the first signal layer, a second differential pair arranged in the second signal layer and the third signal layer in broad-coupled structure.

2. The PCB as claimed in claim 1, wherein the distance between the first signal layer and the second signal layer is greater than or equal to four times the distance between the first reference layer and the first signal layer.

3. The PCB as claimed in claim 1, wherein the first differential pair comprises two transmission lines, the second differential pair is arranged along a perpendicular bisector of a segment between the transmission lines of the first differential pair, and the perpendicular bisector is perpendicular to the first reference layer and the first to third signal layers.

4. The PCB as claimed in claim 1, wherein the first reference layer is a power layer or a ground layer.

5. The PCB as claimed in claim 1, further comprising a fourth signal layer and a second reference layer disposed under the third signal layer, wherein a third differential pair is arranged in the fourth signal layer in edge-coupled structure, and a distance between the third signal layer and the fourth signal layer is greater than a distance between the fourth signal layer and the second reference layer.

6. The PCB as claimed in claim 5, wherein the distance between the third signal layer and the fourth signal layer is greater than or equal to four times the distance between the second reference layer and the fourth signal layer.

7. A printed circuit board (PCB), comprising a first reference layer, a first signal layer, a second signal layer, a third signal layer, a fourth signal layer, and a second reference layer in that order, a distance between the first signal layer and the second signal layer being greater than a distance between the first reference layer and the first signal layer, a distance between the third signal layer and the fourth signal layer being greater than a distance between the second reference layer and the fourth signal layer, a plurality of first differential pairs in edge-coupled structure arranged in the first signal layer, the first differential pairs reference the first reference layer, a plurality of second differential pairs in broad-coupled structure arranged in the second signal layer and the third signal layer, and a plurality of third differential pairs in edge-coupled structure arranged in the fourth signal layer.

8. The PCB as claimed in claim 7, wherein the distance between the first signal layer and the second signal layer is greater than or equal to four times the distance between the first reference layer and the first signal layer, and the distance between the third signal layer and the fourth signal layer is greater than or equal to four times the distance between the second reference layer and the fourth signal layer.

9. The PCB as claimed in claim 7, wherein one of the first differential pairs corresponds to one of the second differential pairs, and corresponds to one of the third differential pairs, each of the first differential pairs comprises two transmission lines, and each of the second differential pairs comprises two transmission lines arranged along a first perpendicular bisector of a segment between the transmission lines of the corresponding first differential pair.

* * * * *